(12) United States Patent
Black

(10) Patent No.: US 10,074,683 B2
(45) Date of Patent: Sep. 11, 2018

(54) IMAGING SYSTEMS HAVING LENS SUBSTRATES WITH TOTAL INTERNAL REFLECTION MITIGATION STRUCTURES

(71) Applicant: Semiconductor Components Industries, LLC, Phoenix, AZ (US)

(72) Inventor: Robert A. Black, Milpitas, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/460,119

(22) Filed: Aug. 14, 2014

(65) Prior Publication Data

US 2015/0054104 A1 Feb. 26, 2015

Related U.S. Application Data

(60) Provisional application No. 61/869,544, filed on Aug. 23, 2013.

(51) Int. Cl.
*H01L 31/0232* (2014.01)
*H01L 27/146* (2006.01)

(52) U.S. Cl.
CPC .. *H01L 27/14629* (2013.01); *H01L 27/14627* (2013.01)

(58) Field of Classification Search
CPC .................................................. H01L 27/14627
USPC .......................................................... 257/432
See application file for complete search history.

(56) References Cited

U.S. PATENT DOCUMENTS

| | | | |
|---|---|---|---|
| 4,900,129 A | 2/1990 | Vanderwerf | |
| 5,956,163 A | 9/1999 | Clarke et al. | |
| 6,493,155 B1 | 12/2002 | Lee et al. | |
| 6,577,447 B1 | 6/2003 | Ai et al. | |
| 7,914,174 B2 | 3/2011 | Ho et al. | |
| 2005/0226123 A1* | 10/2005 | Kimura et al. | 369/112.08 |
| 2006/0125947 A1* | 6/2006 | Packer | H01L 27/14627 348/340 |
| 2008/0036024 A1* | 2/2008 | Hwang et al. | 257/432 |
| 2008/0173793 A1* | 7/2008 | Mokhnatyuk | 250/208.1 |
| 2010/0108973 A1* | 5/2010 | Lee | 257/2 |

* cited by examiner

*Primary Examiner* — Hsin-Yi Hsieh
(74) *Attorney, Agent, or Firm* — Treyz Law Group, P.C.; Michael H. Lyons; David K. Cole

(57) ABSTRACT

Imaging systems may include camera modules that include multiple image sensor pixel arrays. A transparent lens substrate may be formed over the image pixel arrays. Lenses may be formed in the lens substrate such that each lens transmits light to a corresponding image sensor pixel array. Total internal reflection mitigation structures such as groove structures may be formed in one or more surfaces of the lens substrate between each of the lenses. The groove structures may include concentric ring shaped grooves in a surface of the lens substrate so that each lens is surrounded by a respective group of concentric ring shaped grooves. The groove structures may have a depth, angle, shape, and spacing that prevents total internal reflection of image light between the lenses so that high incident angle image light incident on a given pixel array is not captured by an adjacent pixel array.

16 Claims, 4 Drawing Sheets

IMAGING SYSTEMS HAVING LENS SUBSTRATES WITH TOTAL INTERNAL REFLECTION MITIGATION STRUCTURES

This application claims the benefit of provisional patent application No. 61/869,544, filed Aug. 23, 2013, which is hereby incorporated by reference herein in its entirety.

BACKGROUND

This relates generally to imaging systems, and more particularly, to imaging systems with multiple image sensor pixel arrays.

Image sensors are commonly used in imaging devices such as cellular telephones, cameras, and computers to capture images. In a typical arrangement, an imaging device is provided with a single image sensor with a single array of image sensor pixels and a single corresponding lens. Some imaging devices use multiple arrays of image sensor pixels and corresponding lenses to gather image data. This type of system, which is sometimes referred to as an array camera or multi-array imaging system, may be used to extend depth of focus, increase output resolution through super-resolution processing, and capture depth information from a scene.

If care is not taken, high incident angle light can enter a lens corresponding to a first array in the multi-array system and be captured at a second array in the system that is adjacent to the first array. This high incident angle light may cause the arrays to generate undesirable image artifacts such as image flare or ghosting that reduce the quality of the final image produced by the imaging system.

It would therefore be desirable to be able to provide improved imaging systems with multiple arrays of image sensor pixels.

DETAILED DESCRIPTION

Digital camera modules are widely used in imaging systems in devices such as digital cameras, computers, cellular telephones, and other imaging devices. These imaging systems may include an image sensor array having one or more image sensors that gather incoming light to capture an image. An image sensor may include multiple arrays of image pixels. The image pixels in the image pixel arrays may include photosensitive elements such as photodiodes that convert the incoming light into digital data. Each array of image pixels may have any number of pixels (e.g., hundreds or thousands or more). A typical image pixel array may, for example, have hundreds, thousands, or millions of pixels (e.g., megapixels). An image sensor array may include multiple sets of multiple image pixel arrays. For example, an image sensor array may include four image sensors, each having a set of four image pixel arrays, an image sensor array may include one image sensor having four image pixel arrays, may include four image sensors each having one image pixel array, etc. An image sensor may include circuitry such as control circuitry and readout circuitry. Control circuitry and readout circuitry may be shared between one or more image pixel arrays of an image sensor.

Figure 1:
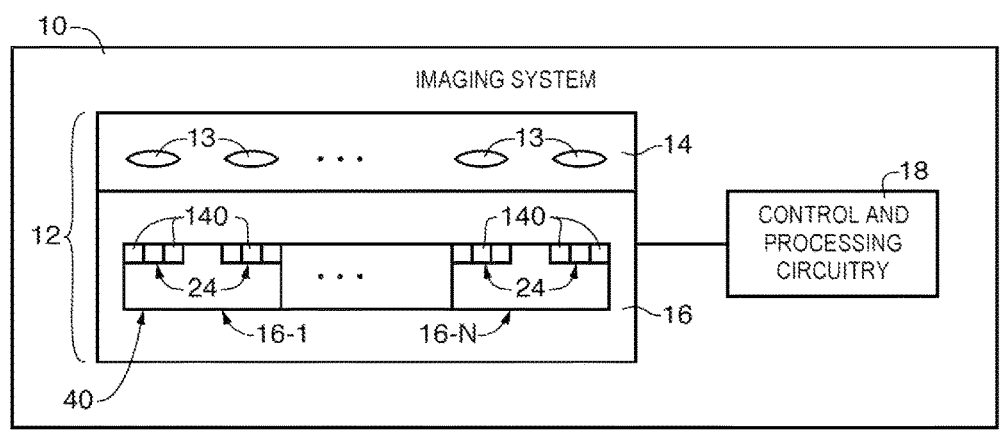
FIG. 1 is a diagram of an illustrative imaging system that contains a camera module with an array of lenses and multiple image pixel arrays in accordance with an embodiment of the present invention.

FIG. 1 is a diagram of an illustrative imaging system that uses an image sensor array to capture images. Imaging system 10 of FIG. 1 may be a portable imaging device such as a camera, a cellular telephone, a video camera, a video security system, an automotive imaging system, or other imaging device that captures digital image data. Camera module 12 may be used to convert incoming light into digital image data. Camera module 12 may include an array of lenses 14 and a corresponding array of image sensors 16. During image capture operations, light from a scene may be focused onto image pixel arrays 24 of image sensors 16-1, . . . 16-N using respective lenses 13 of lens array 14. Lens array 14 and image sensors 16 may be mounted in a common package and may provide image data to circuitry such as control and processing circuitry 18.

Control and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using control and processing circuitry 18. Processed image data may, if desired, be provided to external equipment (e.g., a computer or other device) using wired and/or wireless communications paths coupled to control and processing circuitry 18.

There may be any suitable number of lenses 13 in lens array 14 and any suitable number of image pixel arrays 24 in image sensor array 16. Lens array 14 may, as an example, include N*M individual lenses arranged in an N×M two-dimensional array. The values of N and M may be equal or greater than one, may be equal to or greater than two, may exceed 10, or may have any other suitable values. Image sensor array 16 (sometimes referred to herein as an image sensor integrated circuit) may contain a corresponding N×M two-dimensional array of individual image pixel arrays 24. Each image sensor or image sensor array 16 may include one or more of image pixel arrays 24 of image pixels 140.

The image sensors may be formed on one or more separate semiconductor substrates. For example, sixteen image sensors may be formed on a common semiconductor substrate 40 (e.g., a common silicon image sensor integrated circuit die). Each image sensor in image sensor array 16 may include multiple arrays 24 of image pixels 140 or each image sensor in image sensor array 16 may include a single corresponding array 24. Complementary metal-oxide-semiconductor (CMOS) technology or other image sensor integrated circuit technologies may be used in forming image sensor pixels 140. Each image sensor may be identical or there may be different types of image sensors in a given image sensor array integrated circuit.

Each image sensor of image sensor array 16 (sometimes referred to herein as multi-array image sensor 16) may include additional circuitry such as row control circuitry and readout circuitry. Row control circuitry and readout circuitry associated with each image sensor may be shared among one or more of the image pixel arrays 24 on that image sensor. If desired, common row control circuitry and readout circuitry may be used for every array 24 on multi-array image sensor 16, common row control circuitry and readout circuitry may be used for some of the arrays on multi-array image sensor 16, or respective control circuitry and readout circuitry may be used for each array 24 in multi-array image sensor 16. In general, multi-array image sensor 16 may include any desired number of pixel arrays 24 formed on a common semiconductor substrate 40. This example is merely illustrative and, if desired, different arrays 24 may be formed on separate semiconductor substrates.

Figure 2:
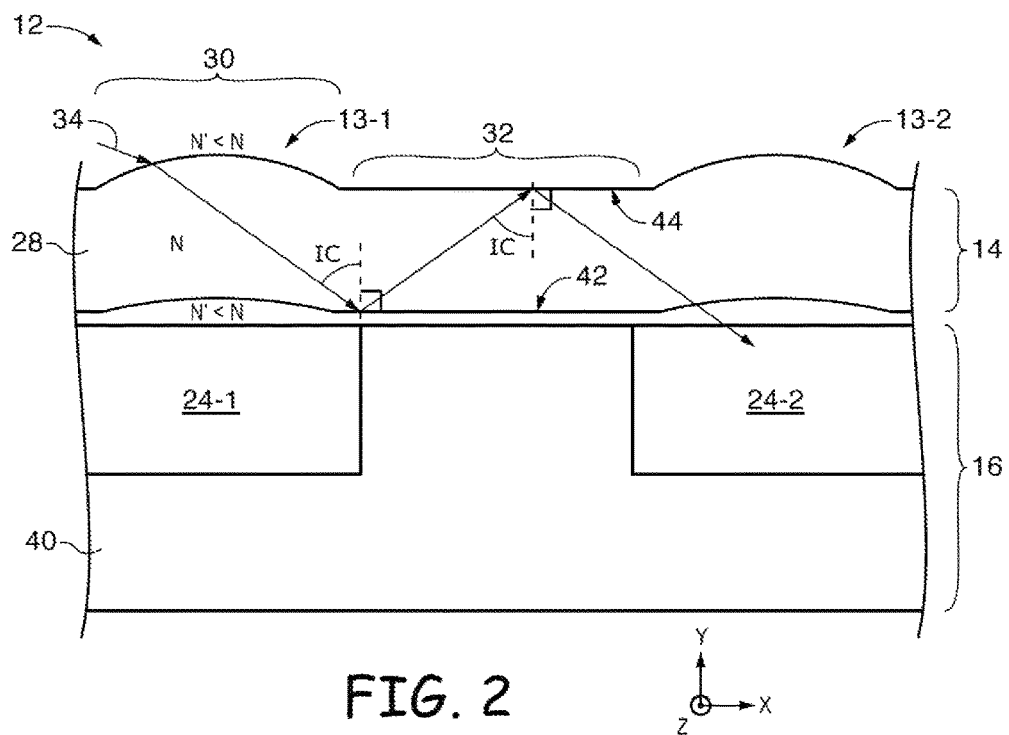
FIG. 2 is a cross-sectional diagram of a camera module having multiple image pixel arrays and a transparent lens substrate formed over the multiple image pixel arrays in accordance with an embodiment of the present invention.

If desired, lens array 14 may include a common lens substrate in which each of lenses 13 are formed (e.g., a substantially transparent lens sheet on which each lens 13 is formed or molded). The lens substrate and lenses 13 may be formed from a single continuous material (e.g., glass, plastic or other substantially transparent dielectric materials). FIG. 2 is an illustrative diagram showing how multiple lenses 13 in lens array 14 may be formed from a common lens substrate over multiple pixel arrays 24.

As shown in FIG. 2, lens array 14 may include multiple lenses 13 formed on lens substrate 28 (e.g., a first lens 13-1, a second lens 13-2, etc.). Lens substrate 28 may be formed from any desired dielectric material that is substantially transparent to image light such as plastic (e.g., image light such as visible light, infrared light, and/or ultraviolet light). Lens array 14 may include lens portions 30 of substrate 28 in which lenses 13 are formed and may include inter-lens portions 32 of substrate 28 (sometimes referred to herein as lens support portions) located between lenses 13 (e.g., portions of lens array 14 on which no lenses are formed). Lens substrate 28 may, for example, be a lens sheet on which lenses 13 are molded. In this way, lens portions 30 and inter-lens portions 32 may be formed from a shared, continuous substrate (e.g., allowing for efficient and inexpensive construction and manufacture of camera module 12).

Lens substrate 28 may be formed over multi-array image sensor 16 such that each lens 13 passes image light onto a corresponding image sensor pixel array 24 (e.g., first lens 13-1 may pass light to a first pixel array 24-1, second lens 13-2 may pass light to a second pixel array 24-2, etc.). Lens substrate 28 may be an optically transparent dielectric having an index of refraction N, whereas portions of imaging system 10 immediately above and below lens substrate 28 may have an index of refraction N' that is less than the index of refraction N of substrate 28 (e.g., air or other dielectrics having a relatively low index of refraction may be formed immediately above and below lens substrate 28). For example, lens substrate 28 may have an index of refraction of N=1.4, N=1.9, an index between N=1.4 and N=1.9, or any other desired index of refraction that is greater than index of refraction N'. In general, index of refraction N' of the portions of imaging system 10 that are formed immediately above and below substrate 28 may be any index of refraction that is less than index of refraction N. In the example where air is located immediately above and below substrate 28, index of refraction N' may be N'=1.0 (in this scenario, index of refraction N may be any desired index of refraction greater than 1.0).

When capturing image light from a scene, lens array 14 may receive high incident angle light such as high incident angle light 34 that is received at a high incident angle with respect to the normal axis of top surface 44 of substrate 28 (e.g., light received at an incident angle of 45 degrees or more with respect to the normal axis of surface 44 of substrate 28). High incident angle light 34 may be refracted upon entering top surface 44 of substrate 28 and may be transmitted to bottom surface 42 of substrate 28.

When light such as high incident angle light 34 passes from an area of higher index of refraction (e.g., index of refraction N associated with substrate 28) to an area of lower index of refraction (e.g., index of refraction N' associated with the regions of system 10 immediately above and below substrate 28), the light may be refracted away from the normal axis of the interface between the area of higher index of refraction and the area of lower index of refraction (e.g., when approaching top surface 44 or bottom surface 42 from within substrate 28). As the angle of incidence I relative to the normal axis of the interface between areas of indices of refraction N' and N approaches a value such that $\sin(I)=N'/N$, then, according to Snell's law, the angle of the light transmitted to the other side of the interface approaches 90 degrees, at which point none of the light is transmitted across the interface. In this scenario, all of the light is reflected within the medium having the higher index of refraction in a process known as total internal reflection. In other words, at a critical incident angle IC such that $IC=\arcsin(N'/N)$ relative to the normal axis of the interface, light will be totally reflected internal to the medium of index of refraction N without passing to the medium having index of refraction N'.

In the example of FIG. 2, high incident angle light 34 is received at first lens 13-1 and transmitted to bottom surface 42 of substrate 28. At bottom surface 28, light 34 may experience total internal reflection and may reflect off of bottom surface 42 of substrate 28 at a critical incident angle $IC=\arcsin(N'/N)$ (or any incident angle with respect to the normal axis of surface 42 that is greater than this critical angle) such that light 34 is transmitted across inter-lens portion 32 of lens array 14. As an example, when N=1.4 and N'=1.0, critical incident angle IC may be equal to approximately 45 degrees (e.g., any image light having an incident angle upon bottom surface 42 of substrate 28 that is greater than or equal to 45 degrees may be totally internally reflected within substrate 28). As another example, when N=1.9 and N'=1.0, critical angle IC may be equal to approximately 32 degrees (e.g., high incident angle image light having an incident angle at surface 42 of greater than or equal to 32 degrees may be totally internally reflected).

As shown in FIG. 2, high incident angle light 34 may be transmitted through bottom surface 42 of substrate 28 at second lens 13-2 (e.g., because lens 13 may not be perfectly planar at lenses 13, thereby altering the angle at which the light is incident upon surface 42 at lens 13-2 relative to inter-lens portions 32) and may be captured at second array 24-2. In this way, image light that is incident on first array 24-1 may be captured by second array 24-2. High incident angle light 34 may thereby cause second array 24-2 to generate unsightly flare or ghosting artifacts (sometimes referred to herein as inter-lens flare artifacts) in response to high incident angle light 34. It may therefore be desirable to be able to provide multi-array image sensors with improved means for mitigating inter-lens flare artifacts caused by total internal reflection within lens substrate 28.

Figure 3:
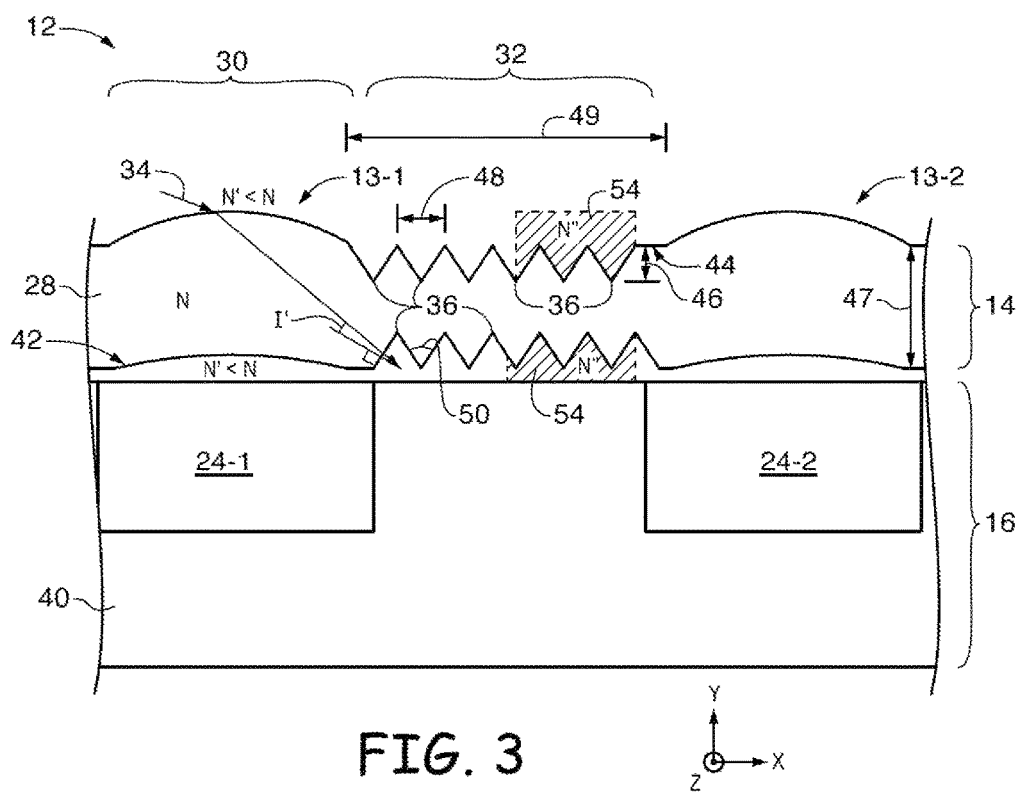
FIG. 3 is a diagram of an illustrative camera module having a transparent lens substrate with total internal reflection mitigating groove structures formed between adjacent lenses for preventing image light incident on a first pixel array from being captured at a second pixel array in accordance with an embodiment of the present invention.

If desired, lens substrate 28 may be provided with total internal reflection mitigation structures such as groove structures for altering the incident angle of light at top surface 44 and bottom surface 42 from within substrate 28 such that light 34 does not approach interface 42 or 44 at an incident angle that is less than or equal to the critical angle associated with indices of refraction N and N'. FIG. 3 is an illustrative diagram showing how substrate 28 may be provided with total internal reflection mitigation structures.

As shown in FIG. 3, total internal reflection mitigation structures 36 may be formed in lens substrate 28 at inter-lens region 32 of lens array 14. In the example of FIG. 3, total internal reflection mitigation structures 36 are groove structures formed in top and bottom surfaces 42 and 44 of substrate 14 (sometimes referred to herein as notch structures, indentation structures, grooves, or notches). Groove structures 36 may be formed in surfaces 42 and 44 by, for example, molding the grooves into substrate 28 during manufacture of lens array 14 or by cutting or etching the grooves into substrate 28 after molding lenses 13 onto substrate 28. In the example of FIG. 3, groove structures 36 have a sharp "V" shape. This example is merely illustrative. If desired, grooves 36 may have a rounded shape (e.g., a "U" shape or other continuously curved concave shape). Rounded grooves may be more easily manufactured than sharp grooves and may allow for increased structural integrity of substrate 28 relative to sharp grooves.

Grooves 36 may alter the angle at which high incident angle light 34 is incident upon top surface 44 and bottom surface 42 of substrate 28. Grooves 36 may be provided with a depth 46, a spacing 48, and/or an angle 50 such that grooves 36 prevent total internal reflection of high incident angle light 34 at surfaces 44 and 42. In other words, grooves 36 may be formed in inter-lens region 32 such that the incident angle of any light received from lenses 13 at inter-lens region 32 at top and bottom surfaces 42 and 44 of substrate 28 is less than the critical angle IC=arc sin (N'/N). For example, the spacing, depth, and angle of grooves 36 may be selected such that high incident angle light 34 reaches bottom surface 42 (or top surface 44) of substrate 28 at an incident angle I' with respect to the normal axis of the interface that is less than incident angle IC associated with indices of refraction N and N'. As an example, spacing 48 and depth 46 of grooves 36 may each be 0.1 microns, 1 micron, 10 microns, 100 microns, 1 mm, 3 mm more than 3 mm, more than 100 microns, less than 100 microns, or any other desired length such that total internal reflection of high incident angle light 34 at inter-lens region 32 is mitigated.

If desired, depth 46 may be selected based on the thickness 47 of substrate 28, the spacing 49 between lenses 13, and/or the shape of lenses 13. In general, deeper grooves 36 may allow for better mitigation of total internal reflection whereas shallower grooves may allow for increased structural integrity and strength of substrate 28. As an example, substrate 28 may have a thickness of between 100 microns and 1 mm. Lens spacing 49 may be between 1 and 5 mm. This is merely illustrative and, in general, any desired lens spacing 49 and substrate thickness 47 may be used.

If desired, grooves 36 in top surface 44 may be offset with respect to grooves 36 in bottom surface 42 of substrate 28. As shown in FIG. 3, the peaks of grooves 36 in top surface 44 are aligned with the troughs (valleys) of grooves 36 in bottom surface 42. In this way, a maximum thickness of substrate 28 between lenses 13 may be maintained across region 32 (e.g., to ensure maximum structural strength of substrate 28 between lenses 13, thereby preventing cracking or breaking of substrate 28 during manufacture of normal use of imaging system 10).

If desired, optional absorptive structures 54 may be formed above top surface 44 of substrate 28 and/or below bottom surface 42 of substrate 28. Absorptive structures 54 may serve to substantially absorb light 34 that is transmitted through grooves 36 (because grooves 36 prevent total internal reflection of light 34). In this way, structures 54 may prevent light 34 from being transmitted through camera module 12 (e.g., to prevent any other flaring or reflection artifacts that may be generated as a result of light 34). Absorptive structures 54 may be formed from any desired material having an index of refraction N" (e.g., an index of refraction N" that is greater than N' and less than N). As an example, absorptive material 54 may include plastic (e.g., a plastic material having an index of refraction that is less than the index of refraction of substrate 28), paint (e.g., black paint), ink, or any desired absorbing material. Absorbing structures 54 may fill grooves 54, may fill a portion of grooves 54, or may extend over grooves 54.

The example of FIG. 3 is merely illustrative. If desired, any desired number of groove structures 36 having any desired shape may be formed on substrate 28 between lenses 13. If desired, groove structures 36 may be formed on only one of surfaces 42 and 44 (e.g., grooves 36 on top surface 44 or bottom surface 46 may be omitted), grooves 36 may be unevenly or evenly spaced between lenses 13, each groove 36 may have the same depth, angle, shape, and/or spacing or different grooves 36 may have different depths, angles, shapes, and/or spacings, grooves 36 on top surface 44 may have the same depth, angle, shape and/or spacing as grooves 36 on bottom surface 42 or grooves 36 on top surface 44 may have different depth, angle, shape, and/or spacing relative to grooves 36 on bottom surface 42, etc. Lenses 13 may have any desired shape (e.g., lenses 13 may have a spherical shape, cylindrical shape, parabolic shape, anamorphic shape, or any desired combination of these shapes).

Figure 4:
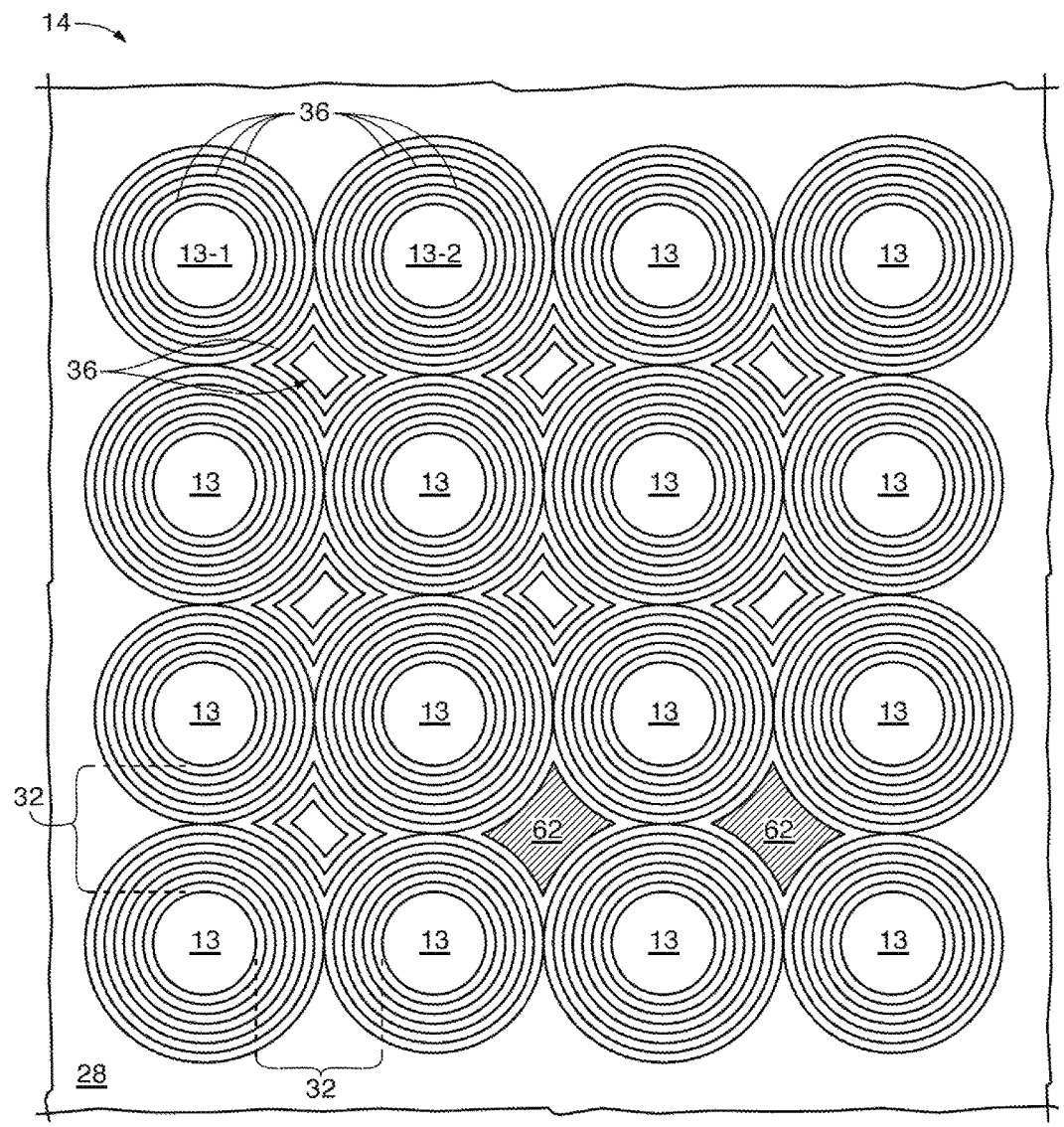
FIG. 4 is a diagram of an illustrative lens substrate having an array of lenses and total internal reflection mitigating groove structures formed in concentric rings around each of the lenses in the array of lenses in accordance with an embodiment of the present invention.

FIG. 4 is an illustrative top-down diagram showing how total internal reflection mitigation structures such as groove structures 36 may be formed between each lens 13 in lens array 14. As shown in FIG. 4, lens array 14 may include an N×M array of lenses 13 that are each separated by total internal reflection mitigating groove structures 35 in the top and/or bottom surfaces of lens substrate 28. In the example of FIG. 4, lens array 14 is a four lens by four lens array of lenses 13.

Grooves structures 36 may be concentric ring-shaped groove (notch) structures that each extend around a corresponding lens 13. Any desired number of concentric groove structures may be formed around a corresponding lens 13 (e.g., two grooves 36 may be formed around each lens 13, three grooves 36 may be formed around each lens 13, more than three grooves 36 may be formed around each lens 13, etc.). In general, at least one groove structure 36 is formed between every pair of lenses 13 for mitigating total internal reflection of high incident angle light between lenses 13. If desired, cusp regions (e.g., indicated by shaded region 62) formed between every four lenses 13 in array 14 may include groove structures 36 or may be free from groove structures 36 (e.g., to decrease manufacturing costs of array 14).

Grooves 36 may form concentric groove rings around each lens 13. If desired, concentric groove rings 36 may have a shape that follows the shape of the corresponding lens 13 (e.g., allowing for efficient mitigation of totally internally reflected light in all directions relative to the corresponding lens). In the example of FIG. 4, lenses 14 have a circular shape and grooves 36 are concentric circular ring shaped grooves extending around each lens 13. The example of FIG. 4 is merely illustrative. If desired, grooves 36 may be include rings of concentric elliptical (oval) grooves, concentric square grooves, concentric triangular grooves, anamorphic grooves, combinations of these, or any other desired ring shape around lenses 13. Grooves 36 may have a similar shape to the corresponding lens 13 around which grooves 36 are formed or may have a different shape (e.g., elliptical groove rings 36 may be formed around circular lenses, circular groove rings 36 may be formed around anamorphic lenses, etc.). If desired, different ring patterns for grooves 36 may be formed on top surface 44 of substrate 28 than bottom surface 42 of substrate 28. Lenses 13 on array 14 may all have the same shape and size or one or more of lenses 13 may each have different shapes and/or sizes. The same number of grooves 36 may be formed between each pair of lenses 13 or different numbers of grooves 36 may be formed between different pairs of lenses 13 in array 14. Grooves 36 between each pair of lenses 13 in array 14 may all have the same concentric ring shape or grooves 36 between different pairs of lenses 13 in array 14 may have different shapes (e.g., concentric elliptical rings of grooves may be formed between a first pair of lenses 13 whereas concentric circular rings of grooves may be formed between a second pair of lenses 13 in array 14). Array 14 may have any desired number, shape, and arrangement of lenses 14 and groove structures 36 (e.g., lens array 14 may be a two lens by two lens array, a four lens by four lens array, a two lens by four lens array, a one lens by two lens array, a three lens by three lens array, etc.). Every pair of adjacent lenses 13 in array 14 may each have the same spacing between lenses or different pairs of adjacent lenses may have different spacings.

In the example of FIG. 4, lenses 13 in lens array 14 are aligned in a grid of rows and columns. If desired, every other row of lenses 13 in array 14 may be staggered (offset) with respect to each other (e.g., in scenarios where lens arrays 24 are offset with respect to each other in multi-array image sensor 16). In general, the pattern of lenses 14 may follow the pattern (layout) of pixel arrays 24 on the underlying image sensor 16 (e.g., so that each lens 13 passes image light to a corresponding array 24). As one example, the odd numbered rows of lens array 14 may be offset with respect to the even numbered rows of array 14 by half the distance between lenses 13.

Figure 5:
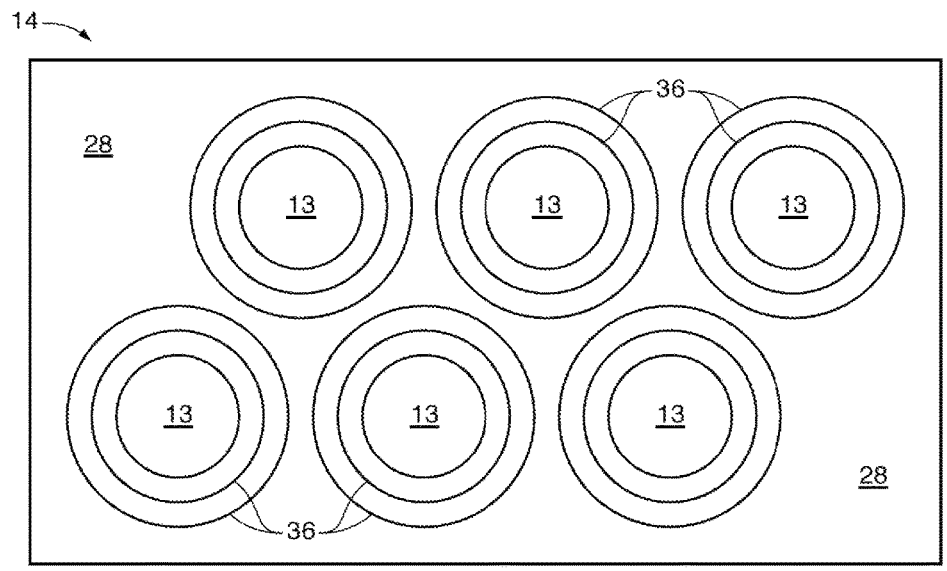
FIG. 5 is a diagram of an illustrative lens substrate having an array of lenses formed in rows that are staggered with respect to each other and including total internal reflection mitigating groove structures formed in concentric rings around each of the lenses in the array of lenses in accordance with an embodiment of the present invention.

FIG. 5 is an illustrative diagram showing how rows of lenses 13 in array 14 may be staggered (offset) with respect to each other. In the example shown in FIG. 5, lens array 14 includes two rows of lenses 13 that are staggered with respect to each other. In particular, the first row of lenses 13 is offset with respect to the second row by half of the distance between adjacent lenses 13 in a given row. Concentric total internal reflection blocking groove structures 36 are formed around each corresponding lens 13. In this way, space occupied on substrate 14 by lenses 13 and grooves 36 may be minimized.

The example of FIGS. 1-5 in which lenses 13 are each formed as a single lens element (e.g., a singlet lens or simple lens) is merely illustrative. If desired, lenses 13 may each include multi-element lenses having any desired number of lens elements (e.g., lenses 13 may be doublet lenses, compound lenses, sets of concave and/or convex lenses, or any other desired type of multi-lens light focusing system). If desired, some lenses in array 14 may be singlet lenses whereas other lenses in array 14 are multi-element lenses. In general, lenses 13 may be any desired lenses formed on a common lens substrate.

Figure 6:
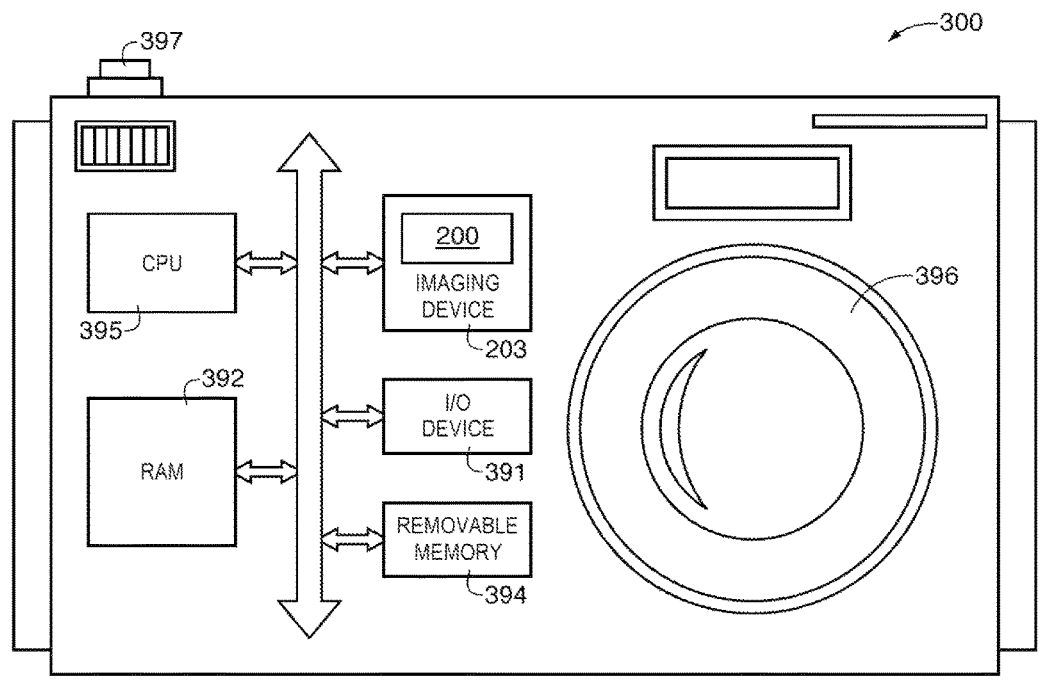
FIG. 6 is a block diagram of a processor system employing the embodiments of FIGS. 1-5 in accordance with an embodiment of the present invention.

FIG. 6 shows in simplified form a typical processor system 300, such as a digital camera, which includes an imaging device 203 (e.g., an imaging device 203 such as system 10 of FIGS. 1-5 having a multi-array image sensor and total internal reflection mitigation/prevention structures). The processor system 300 is exemplary of a system having digital circuits that could include imaging device 203. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300 generally includes a lens 396 for focusing an image on pixel array 200 of device 203 when a shutter release button 397 is pressed, central processing unit (CPU) 395, such as a microprocessor which controls camera and one or more image flow functions, which communicates with one or more input/output (I/O) devices 391 over a bus 393. Imaging device 200 also communicates with the CPU 395 over bus 393. The system 300 also includes random access memory (RAM) 392 and can include removable memory 394, such as flash memory, which also communicates with CPU 395 over the bus 393. Imaging device 203 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating apparatus having multiple image sensor pixel arrays (e.g., multiple image pixel arrays formed on a common semiconductor substrate). For example, a camera module may be provided with multiple image sensor pixel arrays. A transparent lens substrate may be formed over the multiple image pixel arrays. A dielectric material (e.g., air) may be formed between a bottom surface of the transparent lens substrate and the semiconductor substrate on which the pixel arrays are formed. The lens substrate may have a first index of refraction and the dielectric material may have a second index of refraction that is less than the first index of refraction.

Lenses may be formed in the lens substrate such that each lens transmits light to a corresponding image sensor pixel array. Total internal reflection mitigation structures such as groove or notch structures may be formed in one or more surfaces of the lens substrate (e.g., top and/or bottom surfaces of the lens substrate) between each pair of lenses. The groove structures may have a depth, angle, shape, and spacing that prevents total internal reflection of image light between the lenses (e.g., at the top and/or bottom surfaces of the lens substrate).

If desired, the groove structures may include concentric ring shaped grooves in a surface of the lens substrate. For example, each lens in the lens substrate may be surrounded by a respective group of concentric ring shaped grooves in a surface of the lens substrate. If desired, light absorbing structures may fill at least one of the groove structures. The light absorbing structures may have an index of refraction that is less than the first index of refraction and greater than the second index of refraction. If desired, the lenses may include first and second rows of lenses that are offset with respect to each other.

The foregoing is merely illustrative of the principles of this invention and various modifications can be made by those skilled in the art without departing from the scope and spirit of the invention. The foregoing embodiments may be implemented individually or in any combination.

What is claimed is:

1. An imaging system, comprising:
    a first image sensor comprising a first array of multiple adjacent image sensor pixels;
    a second image sensor that is different from the first image sensor and comprises a second array of multiple adjacent image sensor pixels, wherein the first and second arrays each comprise over one hundred image sensor pixels;
    row control circuitry, wherein the row control circuitry is configured to provide row control signals to the first array in the first image sensor and to the second array in the second image sensor;
    a first lens formed directly over each of the over one hundred image sensor pixels in the first array;
    a second lens formed directly over each of the over one hundred image sensor pixels in the second array, wherein the first and second lenses are formed from a lens substrate;
    total internal reflection mitigation structures formed in the lens substrate between the first and second lenses, wherein the total internal reflection mitigation structures comprise at least one groove structure in the lens substrate, and wherein the total internal reflection mitigation structures are configured to prevent total internal reflection of high incident angle image light between the first and second image sensors; and light absorbing structures that fill the at least one groove structure, wherein the lens substrate has a first index of refraction and the light absorbing structures have a second index of refraction that is less than the first index of refraction.

2. The imaging system defined in claim 1, wherein the lens substrate comprises a first lens portion on which the first lens is formed, a second lens portion on which the second lens is formed, and an inter-lens portion between the first and second lens portions, wherein the total internal reflection mitigation structures are formed on at least one surface of the inter-lens portion of the lens substrate.

3. The imaging system defined in claim 1, wherein the lens substrate comprises plastic.

4. The imaging system defined in claim 1, wherein the lens substrate comprises an upper surface and a lower surface that opposes the upper surface, wherein the lower surface is formed adjacent to the first and second arrays of multiple adjacent image sensor pixels, and wherein the at least one groove structure is formed in the upper surface of the lens substrate.

5. The imaging system defined in claim 1, wherein the lens substrate comprises an upper surface and a lower surface that opposes the upper surface, wherein the lower surface is formed adjacent to the first and second arrays of multiple adjacent image sensor pixels, and wherein the at least one groove structure is formed in the lower surface of the lens substrate.

6. The imaging system defined in claim 1, wherein the lens substrate comprises an upper surface and a lower surface that opposes the upper surface, wherein the lower surface is formed adjacent to the first and second arrays of multiple adjacent image sensor pixels, and wherein the total internal reflection mitigation structures comprise a first groove structure formed in the upper surface of the lens substrate and a second groove structure formed in the lower surface of the lens substrate.

7. The imaging system defined in claim 6, wherein the total internal reflection mitigation structures further comprise a third groove structure formed in the upper surface of the lens substrate and a fourth groove structure formed in the lower surface of the lens substrate.

8. The imaging system defined in claim 7, wherein the first and third groove structures in the upper surface of the lens substrate are offset with respect to the second and fourth groove structures in the lower surface of the lens substrate.

9. The imaging system defined in claim 6, wherein the first and third groove structures have a selected depth and a selected angle for mitigating total internal reflection of image light between the first and second lenses.

10. The imaging system defined in claim 6, wherein the first groove structure comprises a ring-shaped groove in the lens substrate formed around the first lens and the third groove structure comprises a ring-shaped groove in the lens substrate formed around the second lens.

11. A camera module, comprising:
    a plurality of image sensor pixel arrays;
    a lens substrate formed over the plurality of image sensor pixel arrays, wherein the lens substrate comprises a plurality of lenses that each transmits light onto a corresponding image sensor pixel array in the plurality of image sensor pixel arrays;
    a plurality of groove structures formed in the lens substrate, wherein the plurality of groove structures is configured to prevent total internal reflection of image light in the lens substrate between the lenses; and
    light absorbing structures that fill at least one groove structure of the plurality of groove structures, wherein the lens substrate has a first index of refraction, and the light absorbing structures have a second index of refraction that is less than the first index of refraction.

12. The camera module defined in claim 11, wherein the plurality of groove structures comprises a plurality of concentric ring-shaped grooves in the lens substrate around a given lens of the plurality of lenses.

13. The camera module defined in claim 12, wherein the plurality of groove structures further comprises an additional plurality of concentric ring-shaped grooves in the lens substrate around an additional lens of the plurality of lenses.

14. The camera module defined in claim 12, wherein the lens substrate comprises first and second opposing surfaces, wherein the second surface is interposed between the first surface and the plurality of image sensor pixel arrays, and wherein the plurality of concentric ring-shaped grooves comprises a plurality of circular ring-shaped grooves in the second surface of the lens substrate.

15. The camera module defined in claim 11, wherein the plurality of lenses comprises first and second rows of lenses, wherein the lenses in the first row of lenses are offset with respect to the lenses in the second row of lenses, and wherein at least one corresponding groove structure of the plurality of groove structures is formed between every pair of lenses in the plurality of lenses.

16. The camera module defined in claim 11, wherein the plurality of image sensor pixel arrays are formed on a common semiconductor substrate and wherein the plurality of lenses comprises at least one multi-element lens.

* * * * *